United States Patent
Glenn

[11] Patent Number: 6,143,588
[45] Date of Patent: Nov. 7, 2000

[54] METHOD OF MAKING AN INTEGRATED CIRCUIT PACKAGE EMPLOYING A TRANSPARENT ENCAPSULANT

[75] Inventor: Thomas P. Glenn, Gilbert, Ariz.

[73] Assignee: Amkor Technology, Inc., Chandler, Ariz.

[21] Appl. No.: 09/176,048

[22] Filed: Oct. 20, 1998

Related U.S. Application Data

[62] Division of application No. 08/926,507, Sep. 9, 1997, Pat. No. 5,962,810.

[51] Int. Cl.[7] .................................................. H01L 23/28
[52] U.S. Cl. ........................... 438/116; 438/64; 438/462; 257/434; 257/790
[58] Field of Search ................... 438/64, 116, 462, 438/66, 68; 257/432, 433, 434, 667, 680, 681, 790

[56] References Cited

U.S. PATENT DOCUMENTS

| | | | |
|---|---|---|---|
| 4,530,152 | 7/1985 | Roche et al. | 29/588 |
| 4,649,418 | 3/1987 | Uden | 357/80 |
| 4,691,225 | 9/1987 | Murakami et al. | 357/80 |
| 4,801,998 | 1/1989 | Okuaki | 357/72 |
| 4,890,383 | 1/1990 | Lumbard et al. | 437/226 |
| 5,043,004 | 8/1991 | Miyauchi | 65/32.2 |
| 5,102,829 | 4/1992 | Cohn | 437/217 |
| 5,126,818 | 6/1992 | Takami et al. | 357/68 |
| 5,192,681 | 3/1993 | Chiu | 437/217 |
| 5,241,133 | 8/1993 | Mullen, III et al. | 174/52.4 |
| 5,250,470 | 10/1993 | Yamaguchi | 437/211 |
| 5,336,931 | 8/1994 | Juskey et al. | 257/787 |
| 5,436,203 | 7/1995 | Lin | 437/209 |
| 5,474,957 | 12/1995 | Urushima | 437/209 |
| 5,530,278 | 6/1996 | Jedicka et al. | 257/432 |
| 5,578,525 | 11/1996 | Mizukoshi | 437/206 |
| 5,593,926 | 1/1997 | Fujihara | 437/209 |
| 5,612,513 | 3/1997 | Tuttle et al. | 174/260 |
| 5,776,798 | 7/1998 | Quan et al. | 438/112 |
| 5,861,680 | 1/1999 | Yamanaka | 257/793 |
| 5,866,953 | 2/1999 | Akram et al. | 257/790 |
| 5,893,723 | 4/1999 | Yamanaka | 438/65 |
| 5,918,113 | 6/1999 | Higashi et al. | 438/642 |

FOREIGN PATENT DOCUMENTS

| | | | |
|---|---|---|---|
| 58-40579 | 9/1984 | Japan | 257/790 |
| 62-9639 | 1/1987 | Japan | 438/112 |
| 63-66139 | 9/1989 | Japan | 257/790 |
| 5-218230 | 8/1993 | Japan | H01L 23/15 |
| 8-274219 | 10/1996 | Japan | H01L 23/28 |
| 89 00337 | 1/1989 | WIPO | H01L 21/56 |

OTHER PUBLICATIONS

Banerji, K., "Development of the Slightly Larger Than IC Carrier (SLICC)", Proceedings of the Feb. 27–Mar. 4, 1994, Technical Program NEPCON WEST '94, pp. 1249–1256.

Levine, B. and Guinther, F., "The Package", *Electronic News*, vol. 42, No. 2112 (1996), pp. 1, 32.

*Primary Examiner*—Donald L. Monin, Jr.
*Assistant Examiner*—Mike Dietrich
*Attorney, Agent, or Firm*—Skjerven, Morrill, MacPherson, Franklin & Friel LLP; James E. Parsons

[57] ABSTRACT

A method of making an integrated circuit package for EPROM, CCD, and other optical integrated circuit devices is disclosed. First, a substrate base having metallized vias extending there through is provided. Second, an integrated circuit die is affixed to a first surface of the substrate, and is electrically connected to the metallized vias. Third, a bead of a viscous adhesive material is applied onto the substrate around the device. The bead covers the side surfaces of the device, the periphery of the upper first surface of the device, and the bond wires. The bead and the upper first surface of the die form a cavity above the die. Fourth, a layer of a transparent encapsulating material is deposited onto the die, within the cavity formed by the bead. Fifth, the encapsulating material is hardened, and subsequently forms an exterior surface of the package. The transparent encapsulating material allows light to illuminate the light sensitive circuitry of the device.

46 Claims, 4 Drawing Sheets

METHOD OF MAKING AN INTEGRATED CIRCUIT PACKAGE EMPLOYING A TRANSPARENT ENCAPSULANT

CROSS-REFERENCE TO RELATED APPLICATION

This is a divisional application of prior U.S. patent application Ser. No. 08/926,507, filed Sep. 9, 1997, entitled "Integrated Circuit Package Employing A Transparent Encapsulant," now issued as U.S. Pat. No. 5,962,810.

FIELD OF THE INVENTION

The present invention relates to integrated circuit packages, and in particular to a package for an integrated circuit device having circuitry whose functioning requires the transmission of light through the package.

BACKGROUND OF THE INVENTION

Integrated circuit devices are typically housed in packages. Typical packages are made of plastic, ceramic, or metal. The packages include internal and external conductive structures, such as metallized vias, metal traces, bond wires, and solder interconnection balls or leadless chip carrier ("LCC") pads, for electrically connecting the integrated circuit device in the package to external circuitry, such as a circuit board.

Certain types of integrated circuit devices, such as erasable programmable read-only memory devices ("EPROM"), charge coupled devices ("CCD") or optical sensing devices, such as those used in document scanners, fingerprint recognition equipment, or other consumer products, require a selected or continuous transmission of light of a selected frequency through the top surface of the package onto the surface of the integrated circuit die within the package. Typically, the packages for such integrated circuit devices have a glass or quartz window in the otherwise opaque top surface of the package. This transparent window is located above the die, and the selected frequency of light passes through the window and impinges on the top surface of the die. Unfortunately, packages having such glass or quartz inserts are relatively expensive to fabricate, which raises the cost of the products in which the integrated circuit devices are used. A less expensive alternative would have wide application.

SUMMARY OF INVENTION

Embodiments of an improved package for integrated circuit devices, such as EPROM and CCD or other optical devices whose functioning requires a selective or continuous transmission of light through a portion of the package, are disclosed. Exemplary methods of making such packages are also described.

The package has a planar insulating substrate base, which may be formed of an epoxy laminate or ceramic. The substrate has a first surface and an opposite second surface. Metallized vias extend through the substrate. An integrated circuit die having light-sensitive circuitry, such as a die for a CCD device, is affixed to the first surface of the substrate. Bond wires are installed which electrically connect the conductive bonding pads on the die to conductive structures on the first surface of the substrate, such as metal traces and contact pads. These conductive structures are in turn electrically connected to the metallized vias through the substrate. Conductive structures on the second surface of the substrate, such as solder interconnection balls or LCC pads, for connecting the package to external circuitry are electrically connected to the metallized vias and hence to the die.

After the bond wires are installed, a bead of an adhesive material such as epoxy plastic is deposited onto the first surface of the substrate peripherally around the die. The bead covers the peripheral side surfaces of the die and the periphery of the upper first surface of the die, including the bonding pads of the die. The bead also covers the bond wires and the conductive structures on the first surface of the substrate. The height of the bead around the die exceeds both the height of the die above the substrate and the height of the normally bowed bond wires, thus forming a central cavity above and with the upper first surface of the die.

After a step of hardening the bead material, a layer of a transparent encapsulating material, such as clear TEFLON® polymeric resin, is deposited onto the die, within the central cavity formed by the bead and the upper first surface of the die. The layer of transparent encapsulating material is subsequently hardened, forming a solid transparent exterior package surface above the optical sensing circuitry of the die.

An alternative method of making the package employs a relatively larger substrate having a plurality of sites which are adapted for the formation of an array of individual integrated circuit packages. Each site has one or more conductive structures on its first and second surfaces, and one or more metallized vias extending through the substrate. An integrated circuit die is attached to each site of the array, and is electrically connected to the metallized vias through the substrate. A bead of adhesive material is deposited onto the first surface of the substrate so that a bead surrounds each die in the array. The beads cover the side surfaces of the dies, the periphery of the upper first surface of the dies, and the bond wires. Together, the bead and the upper first surface of the die define a cavity above each die into which a layer of encapsulating material is deposited.

One way of applying the bead material is to deposit crisscrossing perpendicular beads of the adhesive material on the substrate adjacent to all sides of the dies in the array. The rows and columns of bead material meld together, forming a continuous bead around each die in the array. After the bead material is hardened, a layer of a transparent encapsulating material is placed onto the die within the cavity formed by the bead and the first surface of the die. The encapsulating material is then hardened, and the individual packages in the array are separated.

Among other virtues, the packages and methods described herein provide a lower cost solution to the problem of designing reliable packages for EPROM, CCD, and other optical devices.

DETAILED DESCRIPTION

Figure 1:
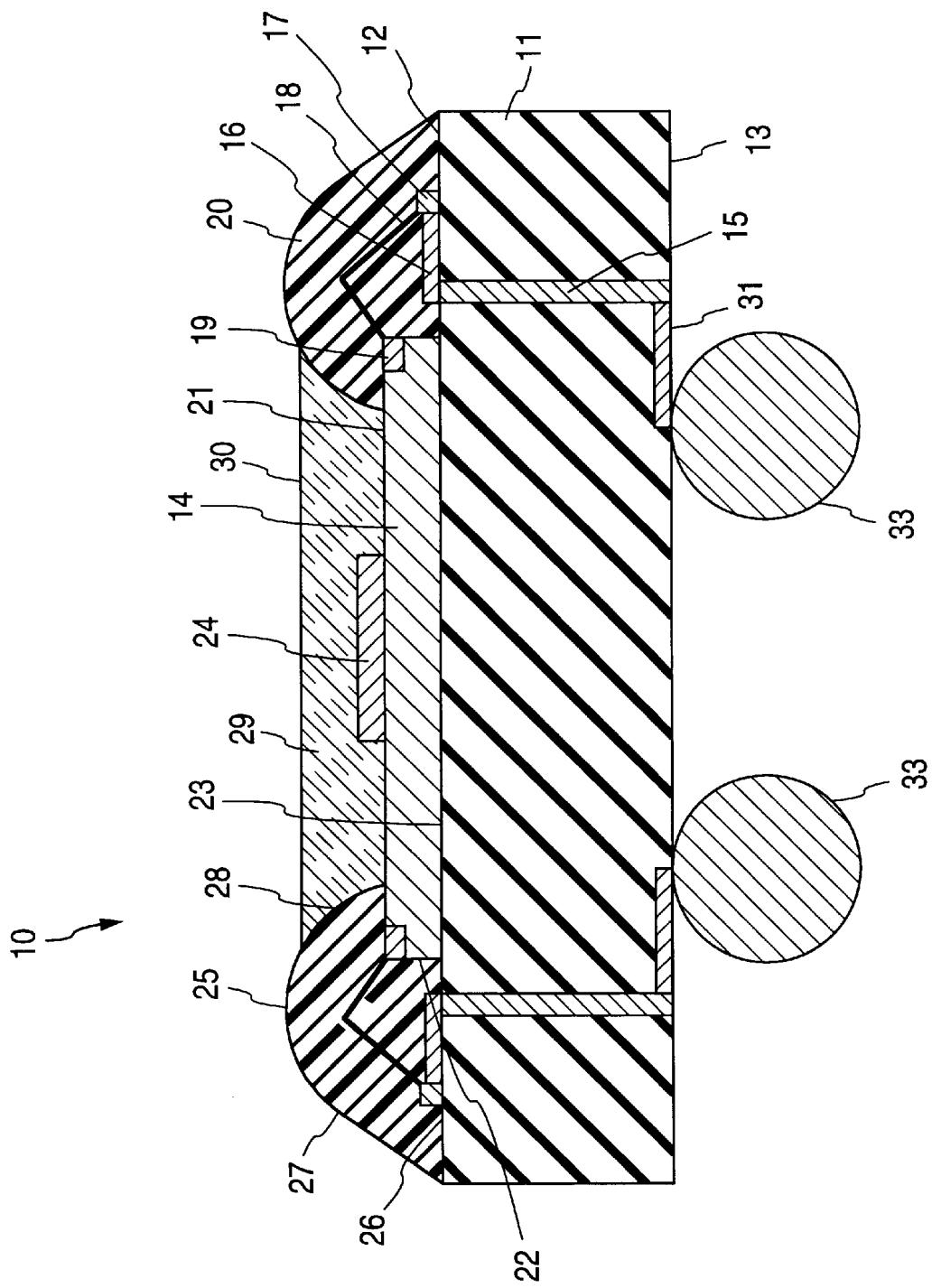
FIG. 1 is a cross-sectional side view of an integrated circuit package.

FIG. 1 is a cross-sectional side view of an exemplary integrated circuit package 10 in accordance with the present invention. Substrate 11 forms an insulating base of package 10. Substrate 11 has an upper first surface 12 and a lower second surface 13. Substrate 11 may be formed, for example, of a conventional epoxy laminate or ceramic. Examples of suitable substrates include Mitsubishi BT, Arlon 45N, and Nelco BT laminate substrates.

An exemplary thickness of substrate 11, between first surface 12 and second surface 13, is between 0.36 mm and 0.56 mm, but the thickness of substrate 11 may vary depending on the application. The perimeter of substrate 11 may be a variety of shapes, again depending on the packaging application. For example, the perimeter of substrate 11 may be square or rectangular.

Integrated circuit die 14 rests on and is affixed to first surface 12 of substrate 11. Die 14 has an upper first surface 21 containing peripheral bonding pads 19, peripheral side surfaces 22, and a lower second surface 23 opposite first surface 21. Conventional epoxy die attach compound, such as QMI 696 available from the QMI Company of San Diego, Calif., may be used to affix lower second surface 23 of die 14 to first surface 12 of substrate 11.

Typically, EPROM, CCD or other optical integrated circuit dies have vision cells or other light-sensitive circuitry on their upper surfaces, which must be selectively or continuously exposed to light of a selected frequency for some functioning of the completed device. In FIG. 1, such circuitry is exemplified by polyimide vision cell 24 on a central portion of upper first surface 21 of die 14. Other non-optical circuitry, not shown in FIG. 1, may also be exposed on first surface 21 of die 14, depending on the application.

Conductive metallized via 15 extends through substrate 11 between first surface 12 and second surface 13. Via 15 may be formed, for example, by drilling a hole through substrate 11 and plating the hole with metal, such as copper, using conventional methods. Via 15 provides a conductive path for electrically connecting conductive structures on first surface 12 and second surface 13 of substrate 11.

In FIG. 1, conductive structures on or adjacent to first surface 12 of substrate 11 electrically connect die 14 to metallized via 15. For example, at the intersection of via 15 and first surface 12 of substrate 11, a first end of a metal trace 16 is electrically connected to via 15. Metal trace 16 extends laterally away from via 15, and its second end is electrically connected to a metal contact 17 on first surface 12 of substrate 11. The term "electrically connected" is used broadly herein to mean a conductive path exists between the "electrically connected" structures, which may be due to a direct or indirect physical connection.

Contact 17 is electrically connected to a first end of a metal bond wire 18. An opposite second end of bond wire 18 is electrically connected to a conductive bonding pad 19 on a peripheral portion of upper first surface 21 of die 14.

Metal trace 16 and metal contact 17 may be formed, for example, of copper that is plated on first surface 12 of substrate 11 using conventional electroplating methods. Bond wire 18 may be formed of gold or aluminum.

A typical package like FIG. 1 will have multiple metallized vias 15, metal traces 16, contacts 17, bond wires 18, and bonding pads 19, the number of which would depend on the application. For clarity, only two of each of these structures are shown in FIG. 1.

Metallized via 15 also intersects lower second surface 13 of substrate 11. At second surface 13, a first end of metal trace 31 is electrically connected to metallized via 15. Metal trace 31 extends laterally on lower second surface 13 away from via 15. A second end of metal trace 31 is electrically connected to a planar metal interconnection ball land (not shown), which is also formed on lower second surface 13 of substrate 11. A metallic solder interconnection ball 33 is joined to the land. Interconnection balls 33 are used to electrically connect package 10, and hence die 14, to external circuitry such as a circuit board. In alternative embodiments, an interconnection ball land may be formed on the lower second surface of the substrate around the metallized via, as opposed to a lateral distance from the via, so that an interconnection ball may be placed directly below the via.

A typical package like FIG. 1 would have multiple metal traces 31, metal lands, and interconnection balls 33 on the lower second surface 13 of its substrate 11, the number of which would depend on the packaging application. For clarity, only two of these structures are shown in FIG. 1.

The interconnection balls 33 of FIG. 1 are characteristic of a ball grid array ("BGA") package. Such interconnection balls are generally arranged in an array pattern, such as X and Y axis rows of balls, on second surface 13 of substrate 11. The particular pattern selected may depend, for example, on the external circuitry to which package 10 is ultimately electrically connected.

The interconnections of the various conductive structures described above, including metallized vias 15, metal traces 16 and 31, contacts 17, bond wires 18, metal lands, and interconnection balls 33, provide an electrically conductive path between bonding pads 19 of die 14 and interconnection balls 33. Metallized vias 15 provide the portion of the conductive path that extends through substrate 11.

There are, of course, other ways known to practitioners to electrically connect an integrated circuit die (or dies) in a package to conductive structures on the exterior of the package or to connect the package itself to external circuitry. As an example, instead of using solder interconnection balls 33, a patterned array of planar metal contacts may be formed on lower second surface 13 of substrate 11, as in a conventional leadless chip carrier ("LCC") package. As another alternative, instead of using bond wires, tape automated bonding may be employed.

Returning to FIG. 1, bead 20 is adjacent to and a covers the peripheral edges of die 14 on first surface 12 of substrate 11. Bead 20 has a top first portion 25, an opposite lower second portion 26, a outer third portion 27, and an inner fourth portion 28 adjacent to die 14. Top first portion 25 of bead 20 forms a peripheral portion of the top surface of package 10. Lower second portion 26 of bead 20 is on and fixed to first surface 12 of substrate 11. Outer third portion 27 of bead 20 forms the peripheral side walls of package 10. Inner fourth portion 28 of bead 20 covers side surfaces 22 of die 14, as well as the outer periphery of upper first surface 21 of die 14, including the interconnections between bond wires 18 and bonding pads 19 on die 14.

As shown in FIG. 1, bead 20 protectively covers each metal trace 16, contact 17, bond wire 18, and bonding pad 19 located on or adjacent to first surface 12 of substrate 11. Bead 20 also covers side surfaces 22 of die 14 and the periphery of upper first surface 21 of die 14, including bonding pads 19. Bead 20 does not, however, cover the central portion of upper first surface 21 of die 14 where polyimide vision cell 24 is located, to avoid interference with the light-sensitive functioning of vision cell 24. The height of bead 20 above first surface 12 of substrate 11 exceeds the height of die 14 and bond wires 18 above first surface 12. Accordingly, bead 20 and upper first surface 21 of die 14 together form and define a cavity above die 14, into which a thin layer of transparent encapsulating material 29 is deposited.

Figure 2:
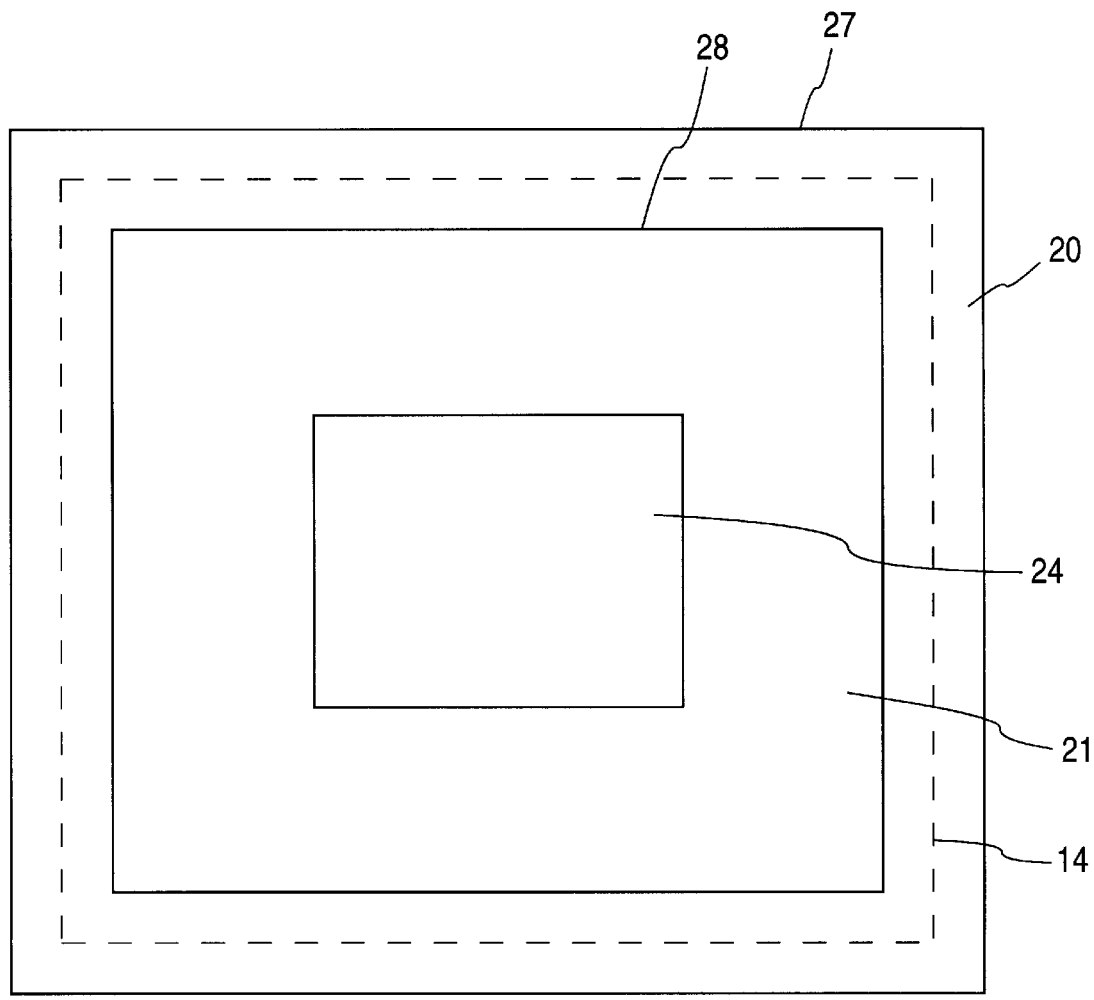
FIG. 2 is a plan view of an integrated circuit package prior to encapsulation.

FIG. 2 is a top view of an incomplete package 10, before a transparent encapsulant is placed onto die 14. In FIG. 2, bead 20 surrounds die 14, contacting side surfaces 22 of die 14 all the way around die 14. To illustrate that bead 20 also covers the periphery of upper first surface 21 of die 14, the periphery of first surface 21 of die 14 is shown by dashed lines. Although die 14 and bead 20 are shown as having square perimeters in FIG. 2, the perimeters of die 14 and bead 20 may vary depending on the application. For example, die 14 and bead 20 may have rectangular perimeters.

Bead 20 is formed of a material that is adhesive. The material of bead 20 should also be somewhat viscous and flowable when initially applied onto first surface 12 of substrate 11, but should be readily hardenable by air drying or heating or the like so that bead 20 forms solid, protective side and top surfaces of package 10.

An example material useful for bead 20 is epoxy, such as Ciba Nagase 9006 epoxy from the Ciba Nagase Company of Japan. Hardening of this epoxy is normally accomplished by heating for about 60 minutes at 150° C. Other suitable epoxy materials usable for bead 20 include Hysol 4451 from Hysol Corporation of City of Industry, Calif. Alternatively, instead of epoxy material, bead 20 may be formed of a silicone rubber, such as silicon rubber number 3140 from the Dow Corning Company.

In FIG. 1, a planar layer of transparent encapsulant 29 covers first surface 21 of die 14, including the central portion of first surface 21 of die 14 where polyimide vision cell 24 is located. When hardened, encapsulant 29 forms a top exterior surface of package 10.

Encapsulant 29 is contained within the square-sided cavity above die 14 which was formed by first surface 21 of die 14 and that part of inner fourth portion 28 of bead 20 whose height above first surface 12 of substrate 11 is greater than the height of die 14 above first surface 12 of substrate 11.

In FIG. 1, the exemplary planar upper first surface 30 of encapsulant 29 is slightly lower, for example, about 0.005 mm lower, than top first portion 25 of bead 20, which may provide protection from abrasions to first surface 30.

The appropriate thickness of the layer of encapsulant 29 depends, for example, on the packaging application and the material chosen for encapsulant 29. A typical material appropriate for encapsulant 29 has a light transmission value that is a function of its thickness.

Encapsulant 29 is formed of a material that is adhesive. The material of encapsulant 29 should be somewhat viscous and flowable when initially applied onto first surface 21 of die 14, but should be hardenable so that the layer of encapsulant 29 forms a solid, protective top surface of package 10 adjacent to die 14.

As discussed above, the EPROM, CCD, and other optical sensing device applications suited for a package such as FIG. 1 require that a surface of the packaged die be selectively or continuously exposed to light of a selected frequency. In such applications, the material chosen for encapsulant 29 should be transparent to the particular frequency of light needed by the application.

In the example of FIG. 1, die 14 has a polyimide vision cell 24 located on a central portion of first surface 21 of die 14. As is typical in CCD or other optical sensing applications, such a vision cell requires exposure to visible light. For such applications, as shown in FIG. 1, encapsulant 29 is formed of a clear material, such as clear TEFLON® synthetic polymeric resin (polytetrafluoroethylene) from the E.I. Dupont Chemical Company, or an equivalent transparent, protective material. A layer of TEFLON® resin having a thickness of about 0.20 mm may be hardened by heating at a temperature of about 150° C. for about 60 minutes. Alternatively, a layer of water white clear epoxy may be used for encapsulant 29.

The dimensions of a package like FIG. 1 will vary with the particular packaging application. As an example, dimensions of components of package 10 may include an approximately 10 mm×10 mm square substrate 11; an approximate 8 mm by 8 mm square die 14; a bead 20 having an approximate 9 mm×9 mm square perimeter; a bead 20 height between top first portion 25 and first surface 12 of substrate 11 ranging from approximately 0.60 mm to 0.80 mm; a bead 20 width between outer third portion 27 and side surfaces 22 of die 14 ranging from approximately 0.60 mm to 0.80 mm; and a relatively thin layer of a transparent encapsulant 29 having a thickness, i.e., a height between upper first surface 21 of die 14 and upper first surface 30 of encapsulant 29, ranging from approximately 0.10 mm to 0.30 mm. As an example, the thickness of encapsulant 29 may be 0.20 mm. Again, such dimensions will vary with the packaging application. For example, larger dies typically require larger packages.

Figure 3:
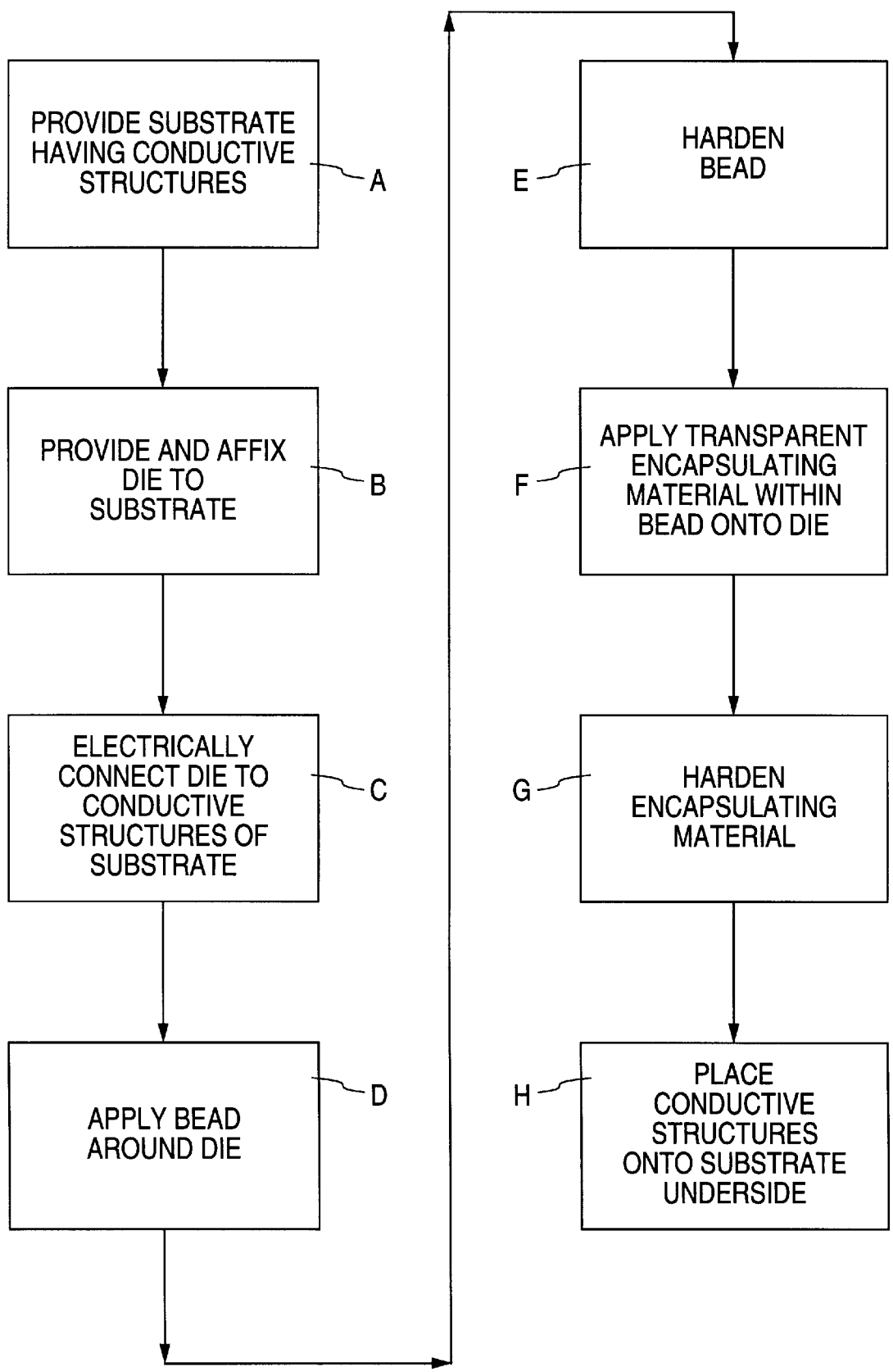
FIG. 3 is a flow chart of a method of assembling an integrated circuit package.

FIG. 3 shows a flow chart for an example method of making a package in accordance with the present invention. As a first step A in the process shown in FIG. 3, an insulating substrate base is provided having conductive structures on and between its first and second surfaces. As an example, substrate 11 of FIG. 1 is provided. In FIG. 1, substrate 11 has metal traces 16 and 31, metallized vias 15, contacts 17, metal lands, and interconnection balls 33, all of which are electrically connected.

As a second step B, an integrated circuit die is provided and placed on the first surface of the substrate. A conventional epoxy die attach material may be used to affix the die to the substrate.

As a third step C, the integrated circuit die is electrically connected to the conductive structures on and through the substrate. Using the example of FIG. 1, bond wires 18 are connected between bonding pads 19 on the periphery of die 14 and contacts 17 on substrate 11 so that die 15 may be electrically connected to metallized vias 15, and hence to interconnection balls 33. A conventional bond wire attaching machine may be used to perform this step.

A fourth step D is the application of a bead of a viscous, hardenable, adhesive material onto the first surface of the substrate, around the integrated circuit die. The bead should be applied so that its height relative to the upper first surface of the substrate exceeds the height of the die above the substrate. In this way, a cavity is formed above the upper first surface of the die into which the transparent encapsulant material may be deposited. FIGS. 1 and 2 show an exemplary bead 20. In those figures, the bead was applied onto the substrate so as to cover the side surfaces of the die and the periphery of the upper first surface of die, as well as the bond wires and other conductive structures on the first surface of the substrate. The bead material does not cover the die's light-activated circuitry.

An example bead material is epoxy, such as Ciba Nagase 9006. Such an epoxy bead may be applied using a syringe. Alternatively, a conventional autodispense machine, such as model 5000 of the Camelot Company or the Millennium model of the Asymtek Company, may be used.

A fifth step E is to harden the bead material. The hardened bead material forms solid, protective side and top surfaces of the package. FIG. 1 shows an example of a solid bead 20.

Where epoxy material is used for the bead, the step of hardening the bead material may be performed by heating to a temperature of approximately 150° C. for about 60 minutes.

After the hardening step, a sixth step F is to apply a layer of a viscous, hardenable, adhesive, and selectively-transparent encapsulating material onto the exposed upper first surface of the die, within the three-dimensional cavity formed by the upper first surface of the die and the now-hardened bead material that surrounds the die. FIG. 1 shows how an embodiment of a package appears after a layer of transparent encapsulant 29 is deposited onto upper first surface 21 of die 14.

Where, for example, the package is for CCD applications or other optical applications, the encapsulating material should be clear so as to be transparent to visible light. An example material is clear TEFLON® resin.

The step of applying a layer of a selectively transparent encapsulating material onto the die may be performed, for example, with a syringe or a conventional autodispense machine. The amount of encapsulating material used affects the thickness of the layer.

A seventh step G is to harden the layer of encapsulating material applied onto the die. This hardening step is performed so that the encapsulating material forms a solid and protective top exterior surface of the package. This hardening step may be performed, for example, by heating the package after the encapsulating material is applied.

Depending on the package configuration, as an additional eighth step H, conductive structures such as solder interconnection balls are placed by conventional methods onto metallizations provided on the underside of the substrate of the package. For example, FIG. 1 shows a package 10 having solder interconnection balls 33 on second surface 13 of substrate 11. Alternatively, such conductive structures could be initially provided on the substrate.

In an alternative method, instead of constructing each package individually, an array of packages similar to those of FIGS. 1–2 are created on a single, relatively larger substrate, and then the array is cut apart to separate the individual packages from each other.

Figure 4:
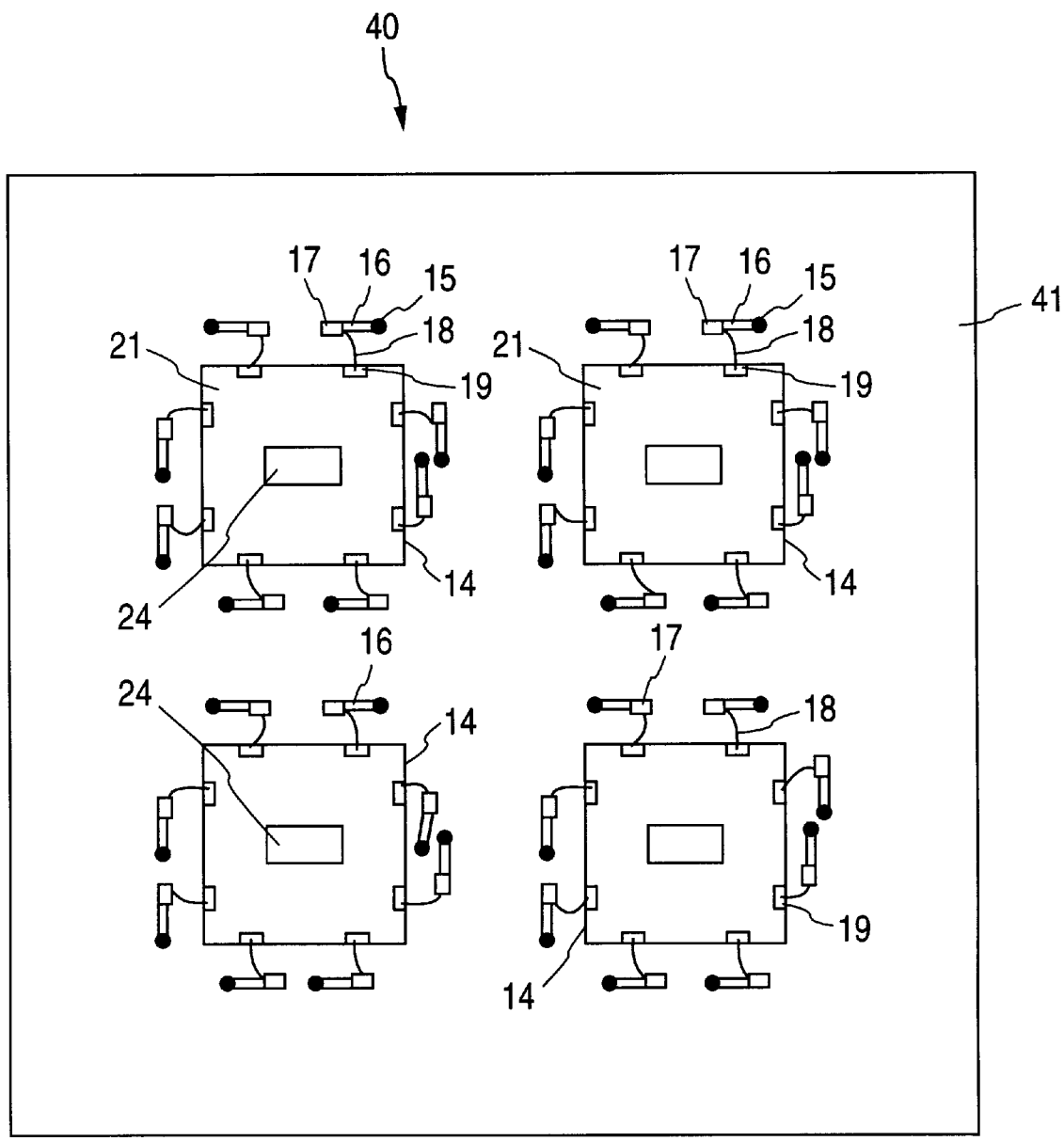
FIG. 4 is a top view of an array of incomplete integrated circuit packages, before bead material is applied onto the array.

FIG. 4 is a top view of an array 40 of four incomplete packages 10 before the step of applying bead material is performed. While array 40 shows only four incomplete packages, the number of packages in the array can vary, depending, for example, on the size of the substrate and dies.

In this alternate method, the first three steps A–C of FIG. 3 are performed, i.e. providing an insulating substrate having conductive structures, providing and affixing an integrated circuit die to the substrate, and electrically connecting the die to the conductive structures on the substrate, except that a larger substrate 41 having four sites for placement of integrated circuit dies is provided, and the other steps are repeated to accommodate each of the four integrated circuit dies that are affixed to substrate 41.

A fourth step is to apply a square bead, like bead 20 in FIGS. 1 and 2, peripherally around each die on array 40 of FIG. 4. In an alternative embodiment, the step of applying a bead of adhesive material is performed by applying a first set of parallel beads of adhesive material adjacent to the integrated circuit dies, and then applying a second set of parallel beads of adhesive material perpendicularly across the first set of parallel beads, so that a crisscrossing pattern of rows and columns of bead material is deposited on the substrate around all sides of each die. The crisscrossing beads meld to form a continuous bead around each die in the array. As discussed above, the bead and the upper first surface of the die together define a cavity above the die, into which the layer of encapsulating material is deposited.

Referring to FIG. 4, after the step of applying bead material onto substrate 41 is performed, the fifth through eighth steps E–H of FIG. 3 are performed for each package in the array, i.e. the steps of hardening the beads, applying the layers of encapsulant within the cavities formed by the beads, hardening the layers of encapsulant, and placing conductive structures such as interconnection balls on the second surface of the substrate for each site on the array.

Subsequently, a step of separating the individual packages in the array of packages from each other is performed. This step may be performed, for example, by cutting through the substrate and bead material using a conventional wafer saw.

The embodiments of packages and assembly methods described above are merely examples of the present invention. Artisans will appreciate that variations are possible within the scope of the claims set forth below.

What is claimed is:

1. A method of making an integrated circuit package comprising:

providing a substrate having a first surface, an opposite second surface, and an electrical conductor through the substrate between said first surface and said second surface;

providing an integrated circuit device, said device having a first surface having a light sensitive portion, and an opposite second surface;

placing the second surface of the integrated circuit device onto the first surface of the substrate;

electrically connecting the integrated circuit device to the electrical conductor;

applying a bead of a viscous adhesive material onto the first surface of the substrate around the integrated circuit device, so that the integrated circuit device is in a cavity formed by the bead and the first surface of the substrate;

hardening said adhesive bead;

applying a layer of a transparent adhesive material onto the first surface of the integrated circuit device and within the cavity;

hardening the layer of transparent adhesive material; and cutting through both the bead and the substrate with a saw.

2. The method of claim 1, wherein the first surface of the substrate is substantially planar.

3. The method of claim 1, wherein the first surface of the substrate is planar.

4. The method of claim 3, wherein the adhesive bead is applied so that, after hardening the adhesive bead, the bead has a height of about 0.6 mm to 0.8 mm.

5. The method of claim 1, wherein the adhesive bead is applied so that, after hardening the adhesive bead, the bead has a height of about 0.6 mm to 0.8 mm.

6. The method of claim 5, wherein the layer of transparent adhesive material is applied so that, after hardening the layer, the layer has a thickness of about 0.1 mm to 0.3 mm.

7. The method of claim 5, wherein said adhesive material is an epoxy material.

8. The method of claim 1, further comprising electrically connecting a bond wire between the integrated circuit device and the electrical conductor; and applying the bead of a viscous adhesive material onto the first surface of the substrate around the device so as to cover the bond wire with the bead material.

9. The method of claim 8, wherein the first surface of the substrate is planar.

10. The method of claim 9, wherein the adhesive bead is applied so that, after hardening the adhesive bead, the bead has a height of about 0.6 mm to 0.8 mm.

11. The method of claim 1, wherein the integrated circuit device has a side surface between the first surface and the second surface of the integrated circuit device; and applying the bead of a viscous adhesive material onto the first surface of the substrate includes covering the side surface and a peripheral portion of the first surface of the device with the bead material.

12. The method of claim 11, wherein the first surface of the substrate is substantially planar.

13. The method of claim 11, wherein the first surface of the substrate is planar.

14. The method of claim 11, further comprising electrically connecting a bond wire between the integrated circuit device and the electrical conductor; and applying the bead of a viscous adhesive material onto the first surface of the substrate around the device so as to cover the bond wire with the bead material.

15. The method of claim 14, wherein the first surface of the substrate is substantially planar.

16. The method of claim 15, wherein a metal trace is provided on the first surface of the substrate that is connected to the electrical conductor through the substrate, and electrically connecting the bond wire includes connecting the bond wire to the metal trace, and applying the adhesive bead includes covering the bond wire and the metal trace with bead material.

17. The method of claim 14, wherein the first surface of the substrate is planar.

18. The method of claim 17, wherein a metal trace is provided on the first surface of the substrate that is connected to the electrical conductor through the substrate, and electrically connecting the bond wire includes connecting the bond wire to the metal trace, and applying the adhesive bead includes covering the bond wire and the metal trace with bead material.

19. A method of making a plurality of integrated circuit packages comprising:

providing a substrate having a first surface, an opposite second surface, and an array of sites each adapted for the formation of an integrated circuit package;

wherein each site has an electrical conductor extending through said substrate between the first surface and the second surface of the substrate;

providing an integrated circuit device for each site of the array, wherein each integrated circuit device has a first surface having a light sensitive portion, and an opposite second surface;

placing the second surface of one of the integrated devices onto the first surface of the substrate at each site;

electrically connecting the integrated circuit device placed on each of the sites to the electrical conductor of the respective site;

applying a bead of a viscous adhesive material onto said first surface of the substrate around each integrated circuit device so that each integrated circuit device is in a cavity formed by the bead and the first surface of the substrate, wherein applying the bead of adhesive material onto the first surface of the substrate includes applying a plurality of first parallel beads onto the first surface of the substrate, with one of said first parallel beads between any adjacent devices, and then applying a plurality of second parallel beads onto the first surface of the substrate in a crisscrossing pattern with said first parallel beads with one of said second parallel beads between any adjacent devices, so that each integrated circuit device is surrounded by bead material;

hardening the adhesive bead;

applying a layer of a transparent adhesive material onto the first surface of each integrated circuit device and within each cavity;

hardening said transparent adhesive material; and separating the packages.

20. The method of claim 19, wherein separating such bead packages includes cutting the substrate.

21. The method of claim 19, wherein the first surface of the substrate is substantially planar.

22. The method of claim 21, wherein separating such bead packages includes cutting the substrate.

23. The method of claim 19, wherein the first surface of the substrate is planar.

24. The method of claim 23, wherein separating such bead packages includes cutting the substrate.

25. The method of claim 19, wherein separating the packages includes splitting each bead and splitting the substrate.

26. The method of claim 25, wherein splitting each bead and splitting the substrate includes cutting the bead and substrate with a saw.

27. The method of claim 19, further comprising electrically connecting a bond wire between each integrated circuit device and the electrical conductor of the site for the respective integrated circuit device; and applying the bead of viscous adhesive material onto the first surface of the substrate so that each said bond wire is covered by the bead material.

28. The method of claim 27, wherein separating the packages includes splitting each bead and splitting the substrate.

29. The method of claim 28, wherein splitting each bead and splitting the substrate includes cutting the bead and substrate with a saw.

30. The method of claim 19, wherein each integrated circuit device has a side surface between the first and second surface of the integrated circuit device; and applying the bead of an adhesive material includes covering the side surface and a peripheral portion of the first surface of each said device with the bead material.

31. The method of claim 30, wherein the first surface of the substrate is substantially planar.

32. The method of claim 30, wherein the first surface of the substrate is planar.

33. The method of claim 32, wherein separating such bead packages includes cutting the substrate.

34. The method of claim 30, wherein separating the packages includes splitting each bead and splitting the substrate.

35. The method of claim 34, wherein splitting each bead and splitting the substrate includes cutting the bead and substrate with a saw.

36. The method of claim 30, further comprising electrically connecting a bond wire between each integrated circuit device and the electrical conductor of the site for the respective integrated circuit device; and applying the bead of viscous adhesive material onto the first surface of the substrate so that each said bond wire is covered by the bead material.

37. The method of claim 36, wherein separating the packages includes splitting each bead and splitting the substrate.

38. The method of claim 37, wherein splitting each bead and splitting the substrate includes cutting the bead and substrate with a saw.

39. A method of making a plurality of integrated circuit packages comprising:

providing a substrate having a first surface, an opposite second surface, and an array of sites each adapted for the formation of an integrated circuit package;

wherein each site has an electrical conductor extending through said substrate between the first surface and the second surface of the substrate;

providing an integrated circuit device for each site of the array, wherein each integrated circuit device has a first surface having a light sensitive portion, and an opposite second surface;

placing the second surface of one of the integrated devices onto the first surface of the substrate at each site;

electrically connecting the integrated circuit device placed on each of the sites to the electrical conductor of the respective site;

applying a bead of a viscous adhesive material onto said first surface of the substrate around each integrated circuit device, so that each integrated circuit device is in a cavity formed by the bead and the first surface of the substrate;

hardening the adhesive bead;

applying a layer of a transparent adhesive material onto the first surface of each integrated circuit device and within each cavity;

hardening said transparent adhesive material; and splitting the bead material and the substrate between the package sites so as to separate individual packages.

40. The method of claim 39, wherein splitting the bead material and splitting the substrate includes cutting the bead material and substrate with a saw.

41. The method of claim 39, further comprising electrically connecting a bond wire between each integrated circuit device and the electrical conductor of the site for the respective integrated circuit device; and applying the bead of viscous adhesive material onto the first surface of the substrate so that each said bond wire is covered by the bead material.

42. The method of claim 41, wherein splitting the bead material and splitting the substrate includes cutting the bead material and substrate with a saw.

43. The method of claim 39, wherein each integrated circuit device has a side surface between the first and second surface of the integrated circuit device; and applying the bead of an adhesive material includes covering the side surface and a peripheral portion of the first surface of each said device with the bead material.

44. The method of claim 43, wherein splitting the bead material and splitting the substrate includes cutting the bead material and substrate with a saw.

45. The method of claim 43, further comprising electrically connecting a bond wire between each integrated circuit device and the electrical conductor of the site for the respective integrated circuit device; and applying the bead of viscous adhesive material onto the first surface of the substrate so that each said bond wire is covered by the bead material.

46. The method of claim 45, wherein splitting the bead material and splitting the substrate includes cutting the bead material and substrate with a saw.

* * * * *